(12) United States Patent
Chen et al.

(10) Patent No.: US 7,832,645 B2
(45) Date of Patent: Nov. 16, 2010

(54) FLASH MEMORY CARD EXPANDER

(75) Inventors: Ben Wei Chen, Fremont, CA (US);
David Sun, Fountain Valley, CA (US);
George K. L. Shiu, S. Pasadena, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 377 days.

(21) Appl. No.: 11/401,024

(22) Filed: Apr. 10, 2006

(65) Prior Publication Data
US 2007/0235544 A1    Oct. 11, 2007

(51) Int. Cl.
*G06K 19/06*    (2006.01)
(52) U.S. Cl. ........................ 235/492; 439/638
(58) Field of Classification Search ................. 235/486, 235/492
See application file for complete search history.

(56) References Cited

U.S. PATENT DOCUMENTS

| | | | |
|---|---|---|---|
| 5,991,530 A * | 11/1999 | Okada et al. | 703/25 |
| 6,648,224 B2 * | 11/2003 | Lee | 235/451 |
| 6,733,328 B2 * | 5/2004 | Lin et al. | 439/501 |
| 6,908,038 B1 | 6/2005 | Le | 235/492 |
| 6,915,956 B2 | 7/2005 | Liu et al. | 235/492 |
| 7,000,054 B2 * | 2/2006 | Kwong et al. | 710/302 |
| 7,349,719 B2 * | 3/2008 | Buniatyan | 455/557 |
| 2002/0185533 A1 * | 12/2002 | Shieh et al. | 235/441 |
| 2003/0054858 A1 * | 3/2003 | Yambe | 455/557 |
| 2004/0041024 A1 * | 3/2004 | Liu et al. | 235/441 |
| 2004/0042323 A1 * | 3/2004 | Moshayedi | 365/232 |
| 2004/0225796 A1 * | 11/2004 | Hanson et al. | 710/301 |
| 2005/0021891 A1 | 1/2005 | Hsieh et al. | |
| 2006/0258224 A1 * | 11/2006 | Liao | 439/638 |

FOREIGN PATENT DOCUMENTS

| | | |
|---|---|---|
| TW | 468897 | 12/2001 |
| TW | 578093 | 3/2004 |

* cited by examiner

*Primary Examiner*—Jamara A Franklin
(74) *Attorney, Agent, or Firm*—Sawyer Law Group, P.C.

(57) ABSTRACT

Method and system for expanding the memory capacity of devices that use flash memory cards. In one aspect, a memory card expander assembly includes an adaptor shaped to be connected to a memory card slot of a host device, and a receptacle assembly in communication with the adaptor and operative to be attached to the host device. The receptacle assembly includes an expanded memory card slot operative to connect to a memory card such that the host device can communicate with the connected memory card when the adaptor is connected to the memory card slot.

22 Claims, 9 Drawing Sheets

FLASH MEMORY CARD EXPANDER

FIELD OF THE INVENTION

The present invention relates generally to device memory, and more particularly to a method and system for expanding the memory capacity of devices that use memory cards.

BACKGROUND OF THE INVENTION

Removable flash memory storage cards such as Multi Media Card (MMC) and Secure Digital (SD) cards are increasingly being used in portable devices to obtain more storage for digital data, such as programs and content. Electronic devices such as smart cell phones, multimedia phones, personal digital assistants (PDAs), MP3 players, digital still cameras and digital video recorders provide build-in slots for insertion of removable memory storage cards such as MMC-mobile, MMCmicro, miniSD and microSD cards. These reduced-size form factor cards are preferred because a typical portable device must be lightweight and small in size to fit in a user's hand. Due to very tight spacing, the slot available inside a device typically is designed to use the smallest card available in the market. While this keeps the host device size small, the smallest form factor cards usually cannot provide as much memory density as the larger, standard size cards, and thus have less memory. Currently the smallest form factor cards in the market are the microSD and the MMCmicro cards that are about the size of a fingernail.

Although these miniaturized cards can allow a small and thin portable electronic device to use a small space for the insertion slot, the cards themselves are limited in the amount of flash memory they can carry. Currently, for instance, the maximum capacity of a standard MMC card is 4 gigabytes (GB); for the miniaturized MMCmicro, the maximum capacity is only 512 megabytes (MB) or 1 GB. Similarly, the capacity of the microSD card currently is 1 GB, compared to 2 GB for standard size SD cards. Although nonvolatile flash memory semiconductor IC chips will continue to increase in memory capacity as the transistor process parameters shrink in size (die-shrink) and hence offers more memory capacity per unit die area, the miniaturized micro memory cards will always lag behind their larger sibling cards in total capacity, due to the physical limit in size and thickness. The number of IC chips and sizes that can fit inside small cards are limited compared to the larger cards.

After a removable card has been inserted into a portable device slot, the card capacity defines the amount of memory capacity the portable device can utilize, in addition to any built-in memories of the device. For example, if a 256 MB card is inserted into a card slot of a cell phone, the phone has the capacity of 256 MB (in addition to the phone's internal memory). This memory capacity is not expandable or scalable, unless the card is replaced with another card having a higher capacity, say, 512 MB. If a user wishes to have even higher capacity, he or she will have to wait for the card manufacturers to provide a new reduced-size card having higher memory capacity.

Accordingly, what is needed is the ability to expand the memory capacity of electronic portable devices using reduced sized memory cards without having to replace such memory cards with higher capacity cards, and without affecting the portability of the devices. The present invention addresses such a need.

SUMMARY OF THE INVENTION

The present invention relates to a method and system for expanding the memory capacity of devices that use memory cards. In one aspect of the invention, a memory card expander assembly includes an adaptor shaped to be connected to a memory card slot of a host device, and a receptacle assembly in communication with the adaptor and operative to be attached to the host device. The receptacle assembly includes an expanded memory card slot operative to connect to a memory card such that the host device can communicate with the connected memory card when the adaptor is connected to the memory card slot. For example, the connected memory card can have a different form factor and a higher memory capacity than allowed by the memory card slot of the host device.

In another aspect of the invention, a memory card expander assembly includes an assembly housing including an openable cover and operative to be attached to the housing of a host device. An adaptor shaped for connection to the intended memory card slot connection of the host device is also included; the adaptor is connected to the memory card slot when the expander assembly is in use. The adaptor can be secured within the assembly housing and under the cover of the assembly housing when the expander assembly is not in use. A receptacle assembly provided in the assembly housing is also included; the receptacle assembly is able to communicate with the adaptor. The receptacle assembly includes an expanded memory card slot operative to connect to a memory card such that the host device can communicate with the connected memory card when the adaptor is connected to the memory card slot.

The present invention provides a memory expander for an electronic device that uses the existing memory card slot of the host device to allow standard, larger-sized memory cards to be connected to the host device. This offers limitless interchangeability of memory cards and immediate scalability and expansion of the memory capacity of the host device at a reduced cost per memory capacity. Furthermore, the memory expander of the present invention is attachable to a portable host device without substantially altering the physical form, fit, and function of the device.

DETAILED DESCRIPTION

The present invention relates generally to device memory, and more particularly to a method and system for expanding the memory capacity of devices that use memory cards. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The memory card expander device of the present invention uses the existing memory card slot in a host device and enables expansion of the memory capacity of the host device by connecting to an external card connector that is attachable to the host device without substantially altering the physical form, fit, and function of the host device. Through the use of an external cord connector, larger-sized memory cards having higher memory capacity and lower cost may be used interchangeably with the host device, thereby offering instant access to higher capacity memory cards instead of requiring the user to pay a premium for a miniaturized card or wait for the next generation of IC die-shrink and memory capacity increase to be available.

The present invention provides an expander having an external connector/adaptor for standard size memory cards. This offers flexibility; for example, any type of SD and MMC cards and their respective adaptors (for MMCmobile, miniSD, etc.) can be inserted into the expander connector. A user can replace a memory card with another fresh memory card, e.g., after having filled the memory capacity of the original memory card.

Another advantage is that by using a connector that accepts standard size memory cards, the cost per memory density is reduced, since standard memory cards usually cost less than equivalent-capacity miniaturized memory cards. This invention can utilize a variety of standard flash memory cards that are interchangeable.

The expander of the present invention is therefore a low cost solution that is versatile and permits immediate scalability to expand to higher-density memory cards as well as limitless replacement of memory cards.

Figure 1:
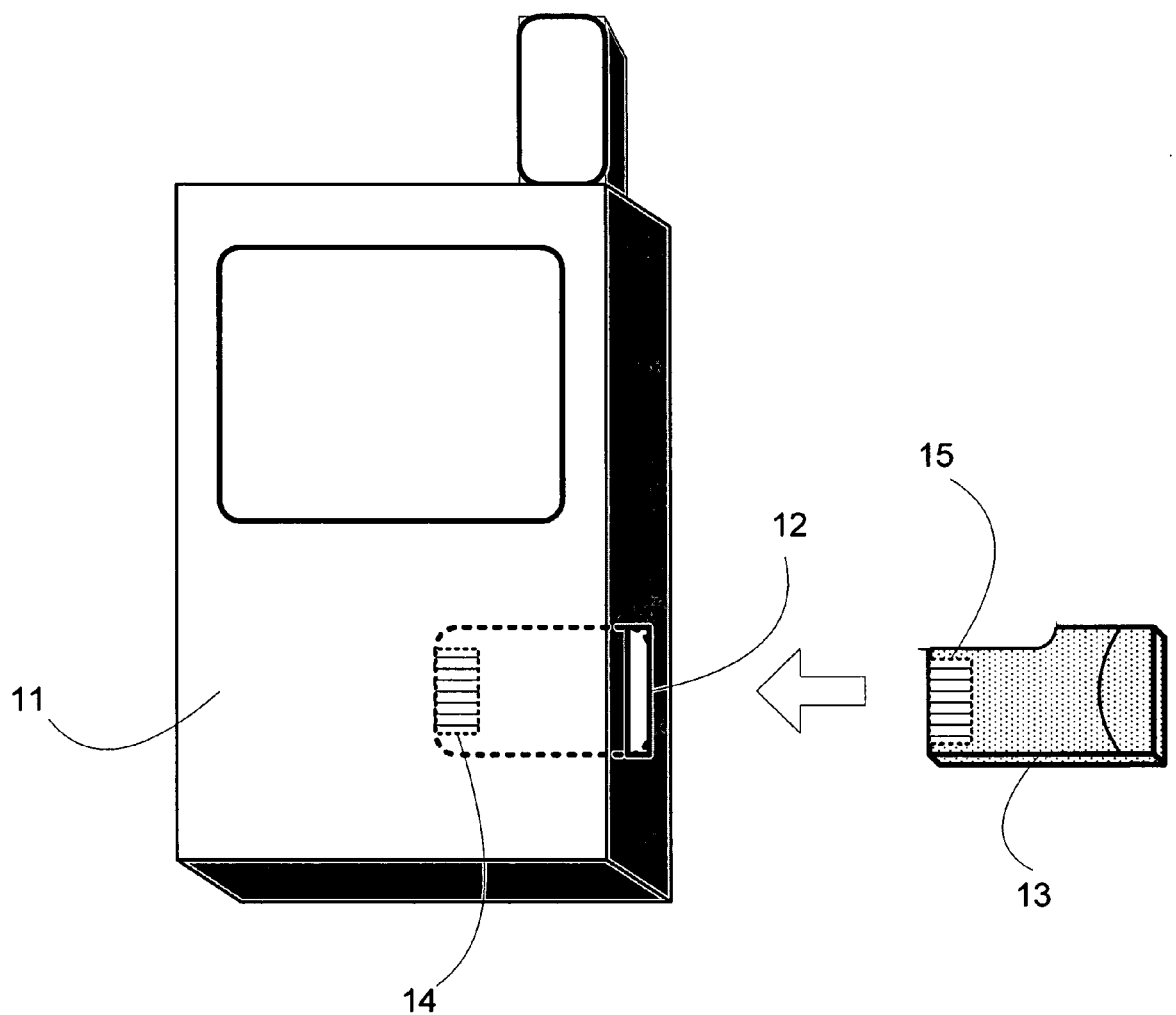
FIG. 1 is a perspective view of a prior art mobile device having a miniaturized flash memory card slot and a flash memory card for insertion into the slot.

FIG. 1 is a perspective view of a prior art mobile phone handset 11. Handset 11 includes a flash memory card insert slot 12 on its lower right-hand side. A microSD card 13 (or other type of designated card that fits the slot) can be inserted into the slot 12 to provide on-board flash memory to the handset device 11. The amount of memory is confined to the memory contained in the microSD card 13. When inserted, the contact pads 15 (gold fingers) located on the backside of the microSD card 13 are each mated to the matching contacts 14 inside the host device slot 12 to provide electrical interconnection between host device and memory card.

Figure 2:
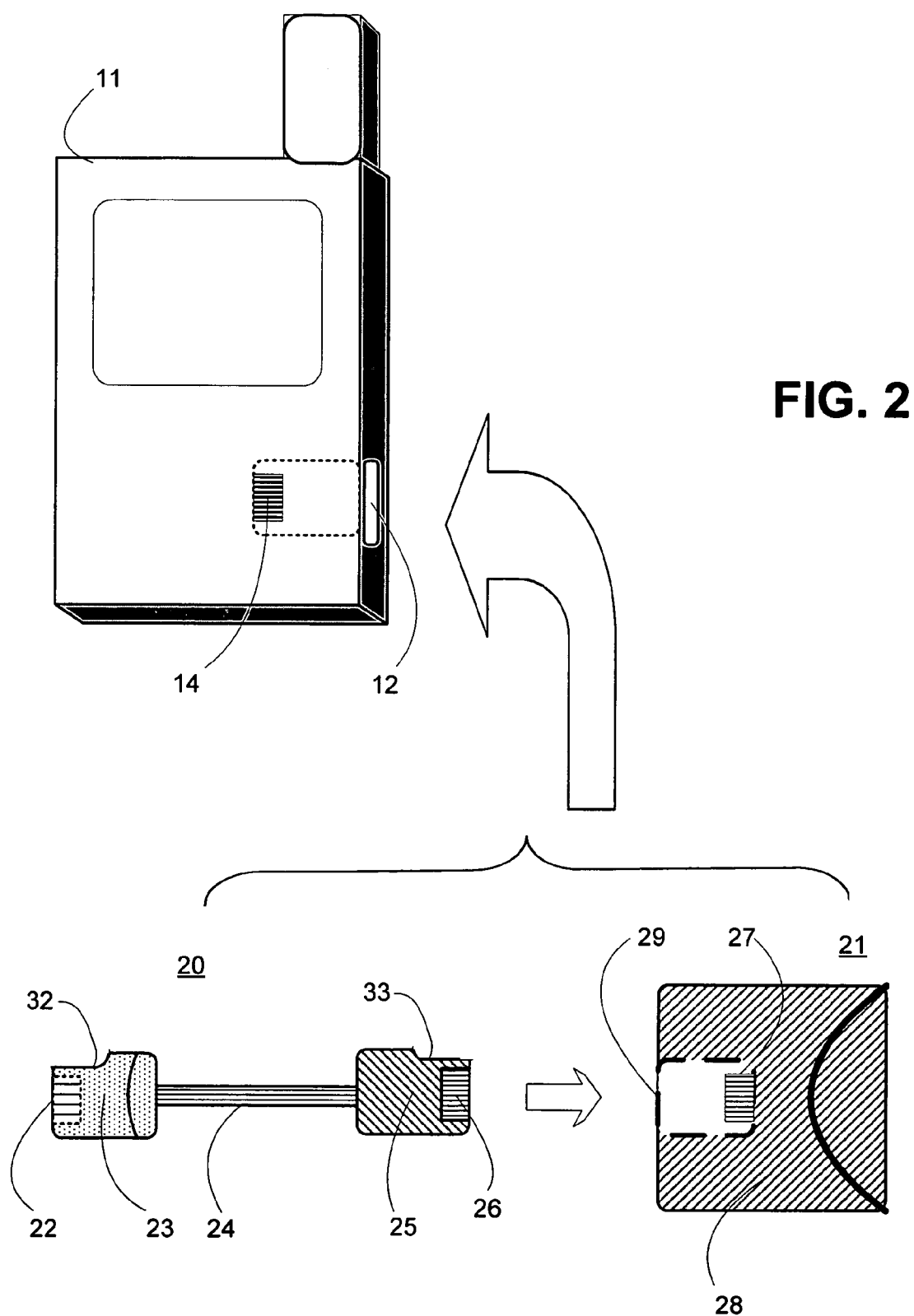
FIG. 2 is a diagrammatic illustration of a host mobile device and two subassemblies of the present invention, the flexible insert adaptor and card connector.

FIG. 2 is a diagrammatic illustration of a host mobile device 11 and two subassemblies of the present invention shown below the device 11 and for use with the device 11. Host device 11 can be a portable, handheld, mobile device, such as a cell phone, personal digital assistant (PDA), MP3 player, global positioning system (GPS) device, pager, remote control, game device, or other electronic device. In alternate embodiments, the host device 11 can be larger sized and not handheld and/or portable.

The first subassembly 20 is a two-adaptor cable connector including a first insert adaptor 23 having contact pads 22 and shaped to fit and connect to the device slot 12. The first adaptor 23 can have one of many possible form factors. For example, the adaptor 23 can have the same form factor as miniSD, microSD, SD, MMCmobile, MMCmicro, MMC Plus, MMC, Universal Serial Bus (USB), USB, Mini USB, Micro USB, Compact Flash (CF), Memory Stick from Sony Corp., Memory Stick Micro, Memory Stick PRO, or other commonly used card formats, as appropriate for the device 11 and its memory card slot 12.

It should be noted that the term "slot" is used herein to refer to the memory card connection port of a host device or connector, and is intended to generically refer to any such port, whether that port's connective operability is implemented as an opening that receives a memory card, or is implemented in another form, e.g., one or more projections to engage a slot on a connected memory card, etc. The card slots described in the embodiments herein typically take the form of openings into which a memory card is inserted.

Adaptor 23 includes I/O contact pads 22, shown in the example of FIG. 2 as a group of exposed parallel pads. Pads 22 are electrically connected to traces inside a flexible cable 24, which can be a thin, ribbon-like flexible cable, for example. Each individual conductor in the cable 24 is connected to a contact pad 22. In the described embodiment, the opposite end of the cable 24 is connected to a second adaptor insert 25 that can also be shaped like the memory card to which adaptor 23 conforms in shape (e.g., any of the types of flash memory card described above for the adaptor 23, or other type of memory card), or shaped to a different form factor. Second adaptor 25 includes contact pads 26 which are electrically connected to the conductors in the cable 24, where each pad 26 forms the opposite terminal of a corresponding pad 24.

The second subassembly 21 is a receptacle assembly including a flash memory card connector 28 and receptacle 29. The card connector 28 can receive one of a wide variety of types of memory cards in different embodiments, including the types mentioned above for the first adaptor 23. In some embodiments, a universal card connector 28 can be used which can connect to multiple types of memory cards. In typical usage, the card connector 28 will accept a physically larger sized memory card than the host slot 12 can accept. The second adaptor 25 of subassembly 20 can be inserted into the receptacle 29 (e.g., card slot) of the flash memory card connector 28, i.e., the receptacle 29 is shaped so that it can receive and connect to the second adaptor 25. Inside the receptacle 29 is a group of mating contact pins 27 for electrical connection to the contact pads 26 of the second adaptor 25. The contact pins 27 are, in turn, connected to metallic spring clip contacts (not shown) inside the card connector 28. Details of the interconnection are described below with reference to FIG. 4.

In some embodiments, the subassembly 20 and receptacle 29 can be made so that the subassembly 20 can be reversed, allowing the first adaptor 23 to be inserted in receptacle 29 and the adaptor 25 inserted in the host device slot 12. For example, this may be useful for a different host device 11 having a different host slot 12, and adaptor 25 is provided with a form factor that matches the different host slot 12. In other embodiments, multiple subassemblies 20 can be available and interchangeable with the receptacle 29. For example, each subassembly 20 can have the same adaptor 25 and a different adaptor 23 with a different form factor. A subassembly 20 having an adaptor 23 that matches the form factor of the host device slot 12 can be chosen and its adaptor 25 connected to receptacle 29.

It should be noted that the orientation of the first adaptor 23 in the embodiment shown in FIG. 2 is in a front-side up position with contact pads 22 located on the backside facing down, and includes a notched side 32 on the upper edge as oriented in FIG. 2. The second adaptor 25 is in the same orientation with a notched side 33 up, but it is in the backside up position with the contact pads 26 facing up. This way, pin 1 of the contact pad group 22 is aligned to pin 1 of the contact pads group 26 through the parallel, individual trace interconnection inside the flexible cable 24.

In a different embodiment, adaptor 25 (for example) can be shaped to the same form factor as adaptor 23, and adaptor 25 is attached to cable 24 having the notched side 34 in the down position, i.e., opposite to the notched side 33 of the other adaptor 23. Since pin 1 of the contact pads groups 26 and 22 would be on opposite sides, the individual trace interconnection inside the flexible cable 24 can be crossed within the cable 24 or within one of the adaptors 23 or 25. Either adaptor 23 or 25 can be plugged into the receptacle 29. This configuration can allow easy connection between the subassembly 20 and the host card slot 12 by using the appropriate adaptor 23 or 25 having an orientation which best fits the host card slot 12. For example, the host card slot 12 may be in an orientation which requires twisting the cable 24 to insert the adaptor 23, but this twisting could be avoided by using the adaptor 25 having an orientation better aligned with the host card slot 12 based on the relative positions of host device 11 and expander assembly of the present invention.

In an alternate embodiment, the cable 24 can be connected directly to the card connector 28 and second subassembly 21 without the use of a second adaptor 25 (first adaptor 23 is still used to connect to the host device card slot 12). For example, in such an embodiment, each individual conductor in the cable 24 can be directly connected to a corresponding contact pin 27 in the connector 28.

Figure 3:
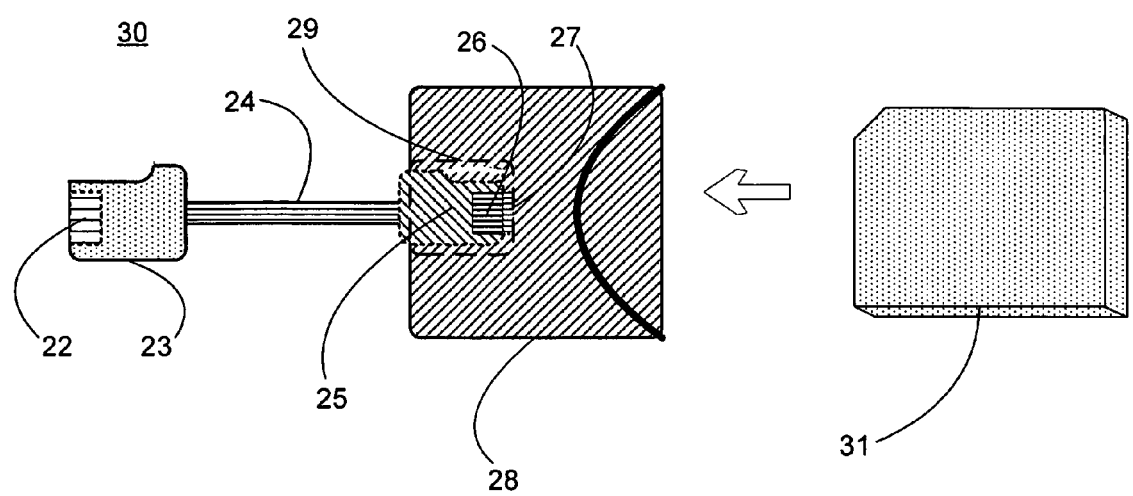
FIG. 3 is a diagrammatic illustration of an assembled subassembly of the expander assembly of the present invention, including a flexible capable adaptor connected to a card connector, and a flash memory card.

FIG. 3 is a diagrammatic illustration of the assembled subassembly of the bare adaptor, cable, and reader portion 30 of the expander assembly of the present invention. Expander portion 30 is shown without a baseboard support or an external covering shell. The expander portion 30 is assembled by inserting the second adaptor 25 from the two-terminal cable connector 20 shown in FIG. 2, into the receptacle opening 29 of the flash memory card connector 28. An external flash memory card 31 is shown next to the card adaptor 28, ready for insertion into the memory card slot of the card connector 28. Once the second adaptor 25 is inserted into the receptacle 29 of the card connector 28, its contact pads 26 are electrically connected to the individual metallic pin contacts 27 inside card connector 28.

Figure 4:
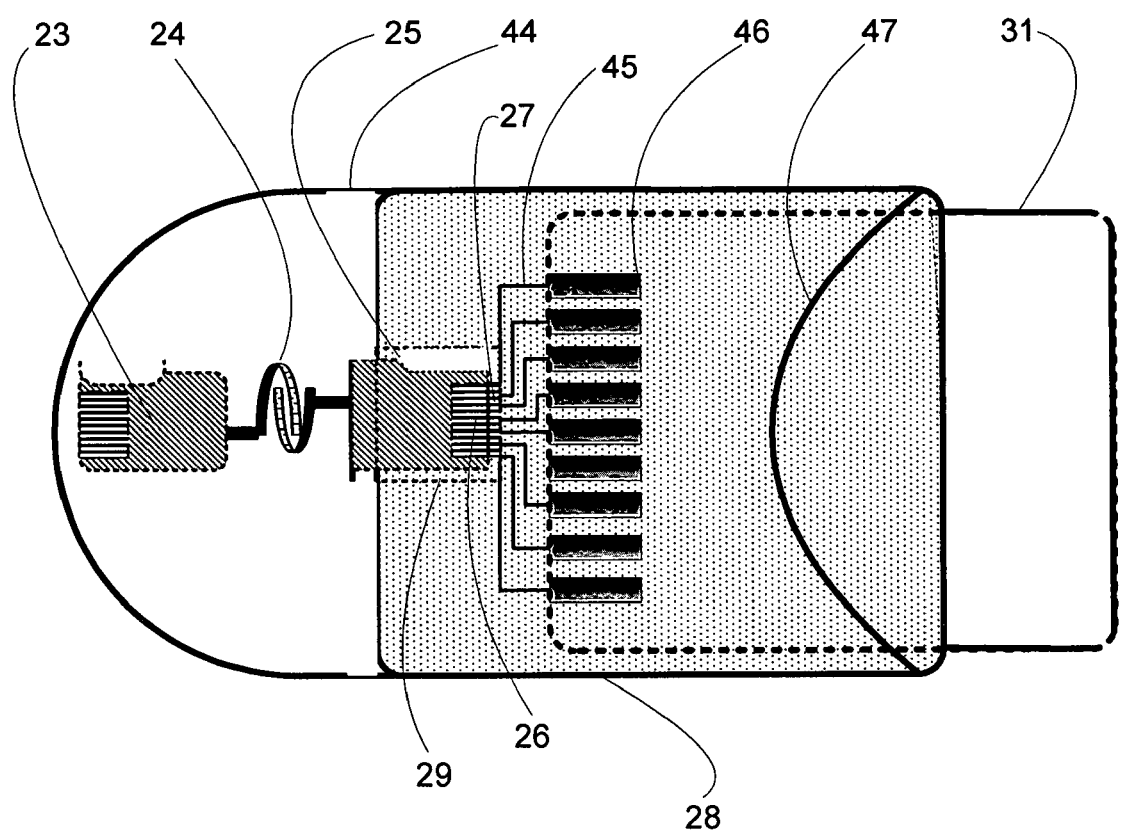
FIG. 4 is a diagrammatic illustration of a baseboard assembly including support for the adaptors and the flash memory card connector of the present invention.

FIG. 4 is a diagrammatic illustration of a baseboard assembly of the present invention. Baseboard 44 is used to seat the assembled adaptor/cable/card connector assembly 30 shown in FIG. 3. In the described embodiment, baseboard 44 has a curved edge at one end, where the first adaptor 23 is positioned. Other embodiments can use other shapes for the baseboard and other parts of the housing. The first adaptor 23 rests on the top surface of the baseboard 44 with an impression or insert in the baseboard, or other fastening mechanism, to secure the adaptor 23 in place.

The flexible cable 24 is stored in a retractable spool as shown to provide compact storage of the cable. In the described embodiment, the spool is spring loaded to allow the cable 24 to be automatically retracted onto the spool with ease, unless the cable is pulled with sufficient force. The second adaptor 25 is shown plugged inside the slot 29 of the card connector 28. The electrical connections of the contact pins 27 inside the slot 29 are shown as individual circuit traces 45 routed between the pins 27 and metallic contact pins 46 inside the card connector 28. The top cover surface of the card connector 28 has a recessed, curved edge 47 for ease of insertion of an external card 31 that is shown inserted inside the card connector 28 in FIG. 4.

The card connector 28 can provide a physically larger-sized memory card slot than the slot 12 of the host device 11 in FIG. 1 or 2. This allows a physically larger memory card to be connected to the host device 11, which can provide greater memory capacity than smaller cards for a lower cost to the user.

Figure 5:
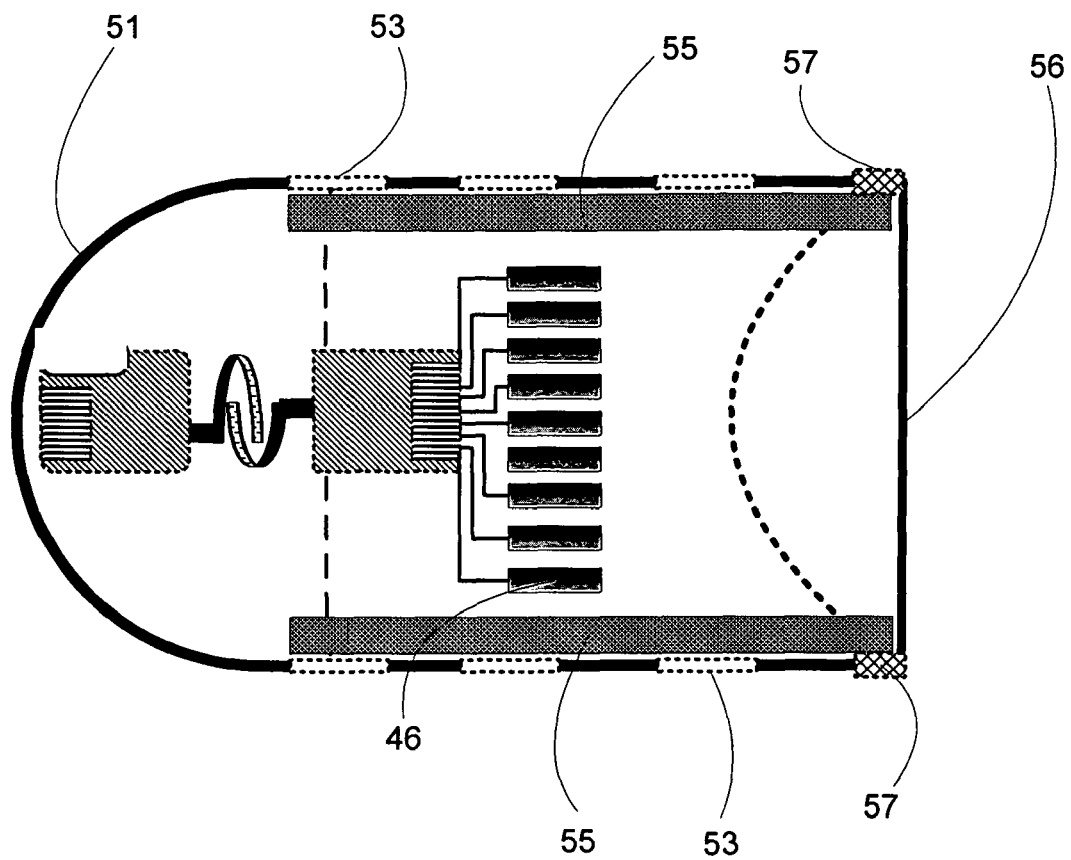
FIG. 5 is a top view of the housing of the assembly of the present invention.

FIG. 5 is a top cross-sectional view of the housing of the assembly of the present invention. A cover shell 51 is placed on top of the baseboard assembly shown in FIG. 4. In the embodiment shown, one end of the shell 51 has a curved shape to conform to the size and shape of the baseboard 44. The opposite end of the shell 51 has a memory card slot opening 56 to allow for insertion of external memory cards. On each side of the cover shell 51 are narrow openings 53 that allow for positioning of the flat cable 24 when the cable 24 and the first adaptor 23 are to be removed from the resting place on the baseboard 44 for insertion into the slot of a host device. This is described in detail below with respect to FIG. 9.

Underneath the baseboard 44 and along each perimeter side edge are two strips 55 of adhesive tape, Velcro cloth, or other adhesive material. The adhesive strips 55 adhere the expander device to the backside surface of the housing of the host device 11, again to be described below with respect to FIG. 9. For example, the bottom perimeter of the baseboard can include recessed grooves for placement of the adhesive strips used to adhere the expander to the surface of the host device. Other adhesive materials or mechanisms can be used in other embodiments.

There are also two hinges 57 located at the two corners of the shell 51 near the side having a slot opening 56. These hinges 57 are for fastening the shell 51 to the baseboard 44 and for allowing the shell 51 to lift and pivot to an open position that allows the user to access the first adaptor 23 in its secured position within the housing of the assembly. Alternate embodiments can use other fastening mechanisms that allow the shell to open and provide user access to the adaptor 23. For example, sliding hinges can be used for allowing linear translation of the shell relative to the baseboard FIG. 6A is a side view of the expander assembly 60 of the present invention. The baseboard 44 is located at the bottom of the assembly 60 and beneath the shell 51. The flexible ribbon cable 24 is shown retracted into a shell 51 in a spool inside the shell. On the underside surface of the baseboard 44 are adhesive strips 55, which attach the assembly 60 to a host device when in use. The top surface of card connector 28 and its contact pins 46 inside the cavity 65 are shown. An external flash memory card (not shown) can be inserted through the opening side 56 of the expander assembly 60.

Figure 6:
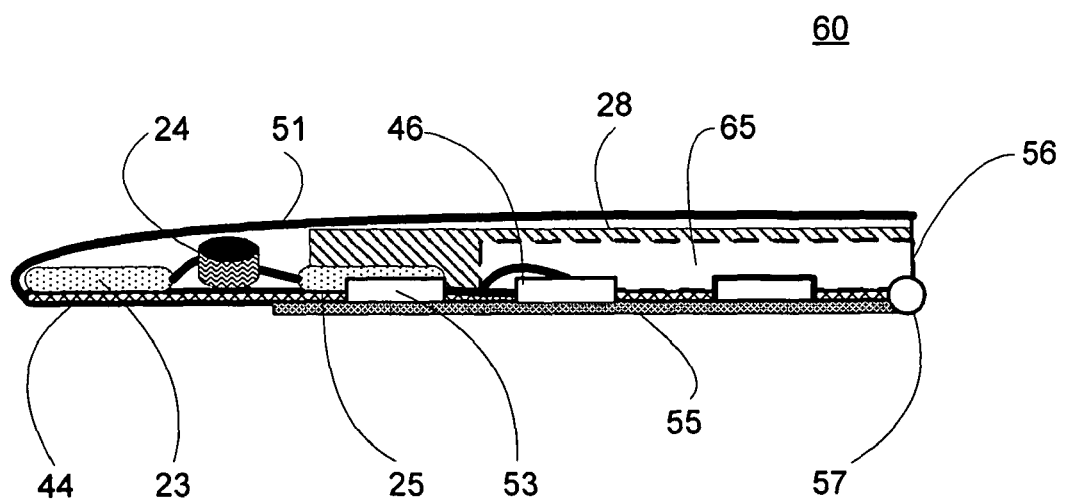
FIG. 6 is a side view of the expander assembly of the present invention including side openings for selective positioning of the first adaptor.

Multiple openings 53 are provided in the sidewall of the shell 51, shown in FIG. 6 at three locations along each side of the shell 51. One of the openings 53 is to be used for selective positioning and routing of the flexible cable 24 to align the adaptor and cable to the host memory card slot when the first adaptor 23 is removed from the shell and connected to the host device. The shell 51 is designed to have a low profile so as not to result in excessive total height of the expander assembly 60. This way, even after attaching to the host device, the expander 60 will not adversely or substantially alter the form, fit and function of the host device. Other embodiments can have additional or fewer sidewall openings, which can be positioned in different locations of the sidewall, top, or other areas of the housing of the expander assembly 60.

Figure 7A:
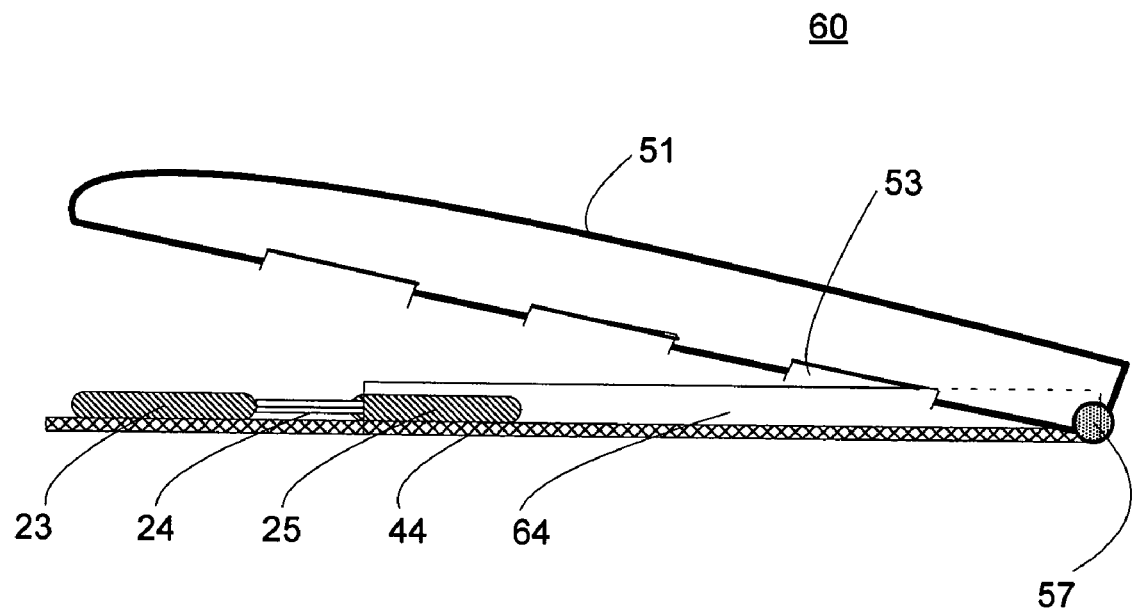
FIG. 7A is a side view of the expander assembly of the present invention with the external shell in a flip open position.

FIG. 7A is a side view of the expander assembly 60 in which the top shell 51 is shown pivoted to the open position to allow the first adaptor 23 to be accessible for removal from its rest location on the baseboard 44. Once the adaptor 23 is removed, the adaptor 23 and flexible cable 24 are extended to the length needed to reach the memory card slot 12 of the host device 11. The flexible cable 24 is "locked" in place by positioning the flexible cable 24 through one of the six opening slots 53 on either side of the shell 51, and closing the top shell 51 over the cable 24 to secure the cable in place in the opening. The cable 24 is preferably positioned through the available slot opening 53 which best aligns the flexible cable 24 to the intended host device slot, as determined by the position of the card slot 12 on the host device 11.

Figure 7B:
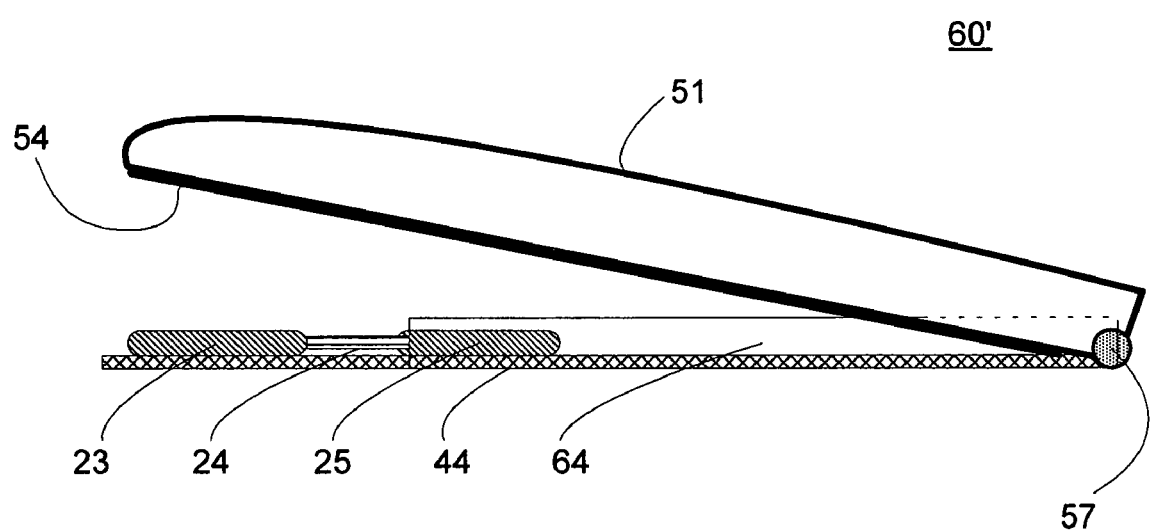
FIG. 7B is a side view of an alternate embodiment of the expander assembly of the present invention in with the external shell in the flip open position.

FIG. 7B is a side view of an alternate embodiment of the expander assembly 60' in which the top shell 51 is shown pivoted to the open position. In embodiment 60', no openings in the shell or other parts of the housing are needed. A compliant strip 54 can be attached to the edge or rim of the shell, and can be made of a compliant or compressible material. Compliant strip 54 of the shell housing contacts the baseboard 44 when the shell 51 is in the closed position. When the cable and adaptor 23 are fully retracted into the housing, the strip 54 seals the shell to the baseboard in the closed position. When the shell is opened, the adaptor removed from the housing and the cable is extended, the cable 24 can be pulled out at any angle to any desired location. When the shell is closed, the cable is sealed tight and locked in place by the strip 54 at the rim, which compresses and conforms around the cable to allow the shell to be fully closed and contacts the baseboard 44 at the other locations around the cable and the other location of the shell 51.

Figure 8:
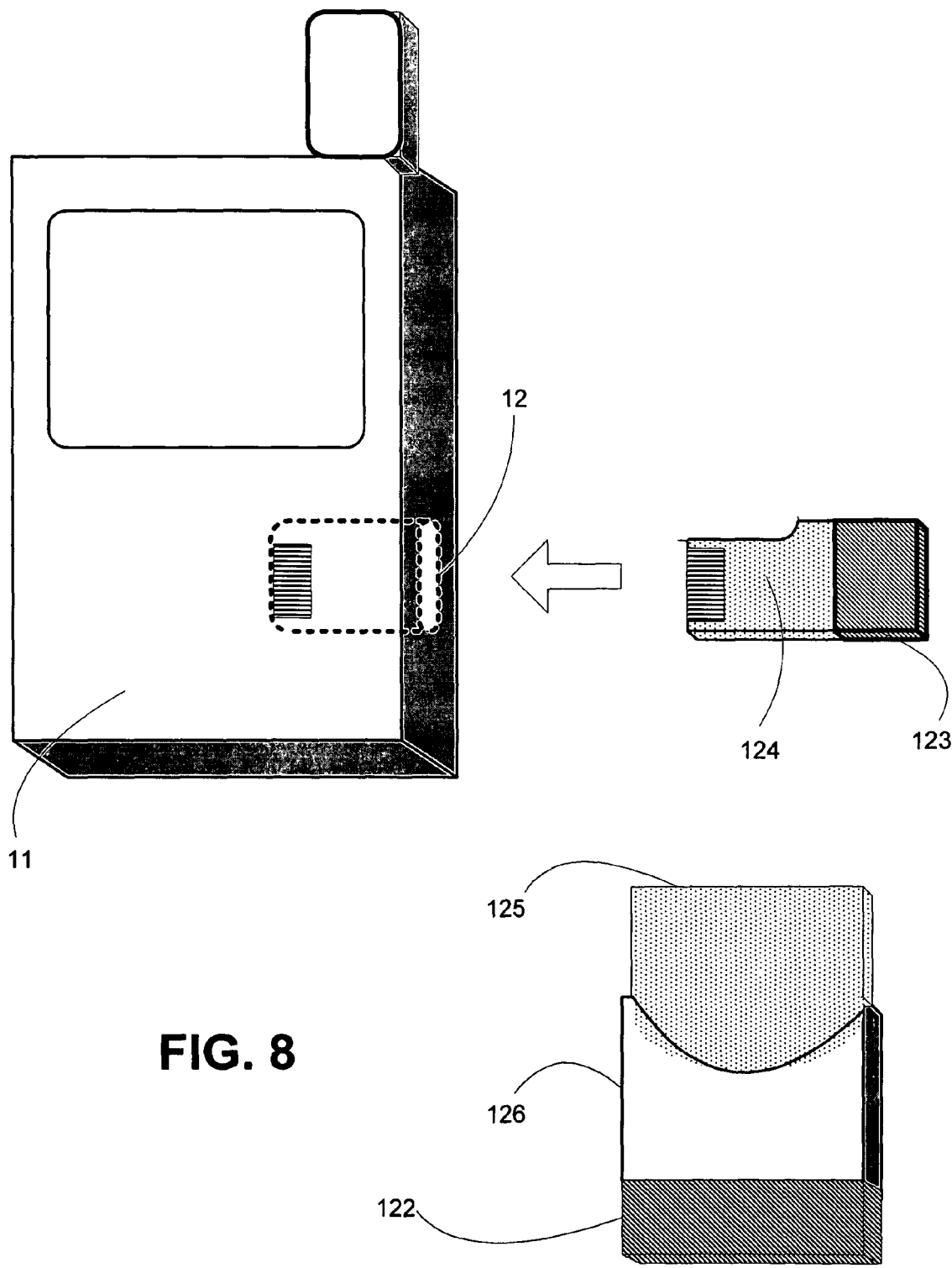
FIG. 8 is a perspective view of a host device and an alternate wireless embodiment of the expander of the present invention.

FIG. 8 is a perspective view of an alternate embodiment of the expander assembly of the present invention. In this embodiment, the flexible cable 24 between the first adaptor and the card connector has been removed so that wireless data communication can be utilized. A first adaptor 124 includes a wireless RF transceiver 123, including a wireless transmitter and wireless receiver, and functions as an I/O insert, such as a Flash card SD I/O insert, to the memory card slot 12 of the host device 11. A "remote" card connector 126 includes a wireless RF transceiver that includes a wireless transmitter for wirelessly transmitting data from an inserted external memory card 125 to a receiver of the transceiver 123 of the first adaptor 124, and a wireless receiver for wirelessly receiving data from the transceiver 123 for storage in the external memory card 125. The card connector 126 can include adhesive strips or other adhesive fixtures on its back or other side that attach the card connector 126 to the host device 11. In other embodiments, other types of wireless communication can be used, e.g., infrared or other electromagnetic communication.

Figure 9:
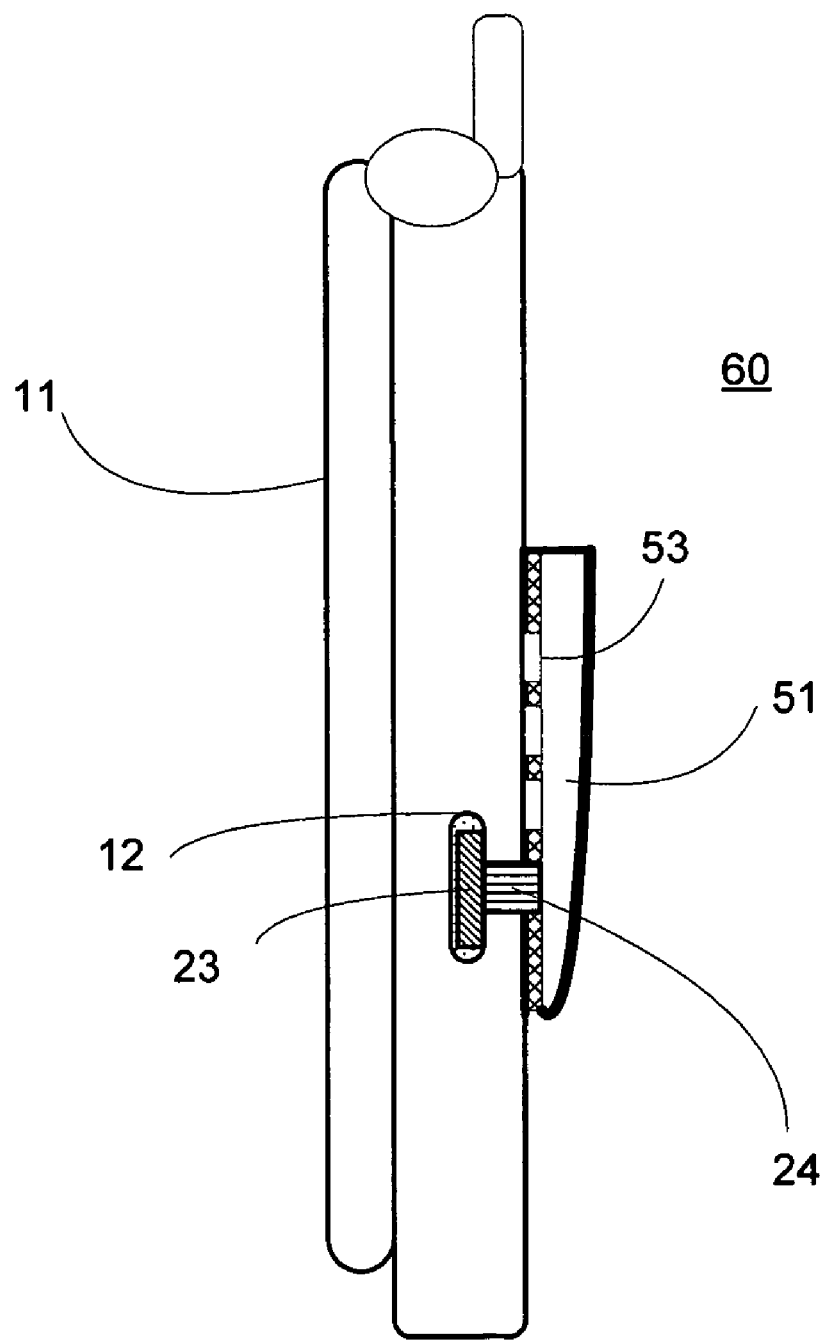
FIG. 9 is a side view of the expander assembly of the present invention attached to the back of a host device.

FIG. 9 is a side view of the expander assembly 60 of the present invention and a host device 11, where the expander assembly is attached to the backside of the housing of the host device 11. As explained above, adhesive strips (or other physical connectors) can be used to secure the assembly to the housing of the host device. In other embodiments, the expander assembly 60 can be attached to other portions or surfaces of the host device 11.

The embodiment of FIGS. 2-7 is shown in the example of FIG. 9. The first adaptor 23 has been inserted into the flash card slot 12 of the host device 11. The cable 24, which is advantageously flat, wraps around the edge of the host device backside, leaving the exposed portion of the cable as shown, and is tugged by the spool inside the expander shell 51 through one of the side opening slots 53.

A similar configuration can also be used for the wireless embodiment of the expander assembly shown in FIG. 8, where the card connector can be attached to the backside (or other surface) of the host device and communicate wirelessly with the first adaptor 124 that has been inserted in the memory card slot of the host device 11.

As shown in FIG. 9, the expander assembly of the present invention enables expansion of the memory capacity of the host device through the use of the host's existing memory card slot. The expander assembly 60 has a thin profile and is compact in size and form, and thus, when it is attached to the housing of a compact, handheld host device, does not substantially alter the physical form, fit, and function of that host device.

Through the use of an external cord connector, larger-sized cards having higher memory capacity and lower cost may be used interchangeably with the host device, thereby offering instant access to higher capacity memory cards instead of paying a premium for a miniaturized memory card or waiting for the next generation of IC die-shrink and memory capacity increase to be available.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A memory card expander assembly comprising:
    an adaptor shaped to be connected to a memory card slot of a handheld or portable host device, the host device having a housing;
    a receptacle assembly having a receptacle assembly housing and in communication with the adaptor and including an attachment mechanism operative to physically attach the receptacle assembly housing to the housing of the host device while the adaptor is connected to the memory card slot, wherein the receptacle assembly includes an expanded memory card slot shaped to connect to a memory card such that the host device communicates with the connected memory card when the adaptor is connected to the memory card slot; and
    a flexible cable connecting the adaptor to the receptacle assembly, wherein at least a portion of the flexible cable is retractable and stored on a spool in the receptacle assembly housing, the flexible cable being extendable to variable lengths to accommodate the distance from the attached receptacle assembly to the memory card slot of the host device.

2. The memory card expander assembly of claim 1, wherein the adaptor has a first physical size to fit into the memory card slot that only accommodates the first physical size, and wherein the expanded memory card slot accommodates the memory card having a second physical size larger than the first physical size.

3. The memory card expander assembly of claim 2 wherein the memory card having the second physical size is able to store a greater amount of memory than a memory card having the first physical size.

4. The memory card expander assembly of claim 1 wherein the attachment mechanism includes an adhesive material.

5. The memory card expander assembly of claim 1 wherein the adaptor is a first adaptor in a subassembly, wherein the subassembly further comprises a second adaptor coupled to the first adaptor by a flexible cable, and wherein the second adaptor is connected to a receptacle in the receptacle assembly.

6. The memory card expander assembly of claim 5 wherein the second adaptor is shaped differently than the first adaptor, wherein the first adaptor is shaped to be connected to the receptacle assembly and the second adaptor is shaped to be connected to a different memory card slot that is physically sized differently than the memory card slot, the different memory card slot provided on at least one other host device.

7. The memory card expander assembly of claim 5 wherein the subassembly is a first subassembly that can be disconnected from the receptacle of the receptacle assembly and a second subassembly can be connected to the receptacle, wherein the second subassembly includes a first adaptor having a different form factor than the first adaptor of the first subassembly, allowing the second subassembly to connect to other host device memory card slots to which the first adaptor of the first subassembly cannot connect.

8. The memory card expander assembly of claim 1 wherein the adaptor can be stored in the receptacle assembly housing when not connected to the memory card slot.

9. The memory card expander assembly of claim 8 wherein the receptacle assembly housing includes a pivoting cover that is in a closed position in normal use of the host device and is pivotable to be opened by a user to allow the user to remove the adaptor from the receptacle assembly housing or place the adaptor in the receptacle assembly housing.

10. The memory card expander assembly of claim 9 wherein a rim of the receptacle assembly housing includes a compliant or compressible material allowing a compliant seal between the pivoting cover and a baseboard of the receptacle assembly housing, the compliant and compressible material allowing passage of the flexible cable at any location through the compliant and compressible material while the openable cover is in a closed position.

11. The memory card expander assembly of claim 9 wherein the flexible cable is routed through one of a plurality of openings in the side of the receptacle assembly housing while the adaptor is connected to the memory card slot and while the pivotable cover is in the closed position.

12. The memory card expander assembly of claim 1 wherein the receptacle assembly includes a wireless transmitter and wireless receiver operative to wirelessly communicate with the adaptor while the adaptor is connected to the memory card slot of the host device, and wherein the adaptor includes a wireless transmitter and wireless receiver for data communication and transmission.

13. The memory card expander assembly of claim 1 wherein the adaptor and the expanded memory card slot have interfaces or form factors of one of the flash memory cards in the group comprising miniSD, microSD, SD, MMCmobile, MMCmicro, MMC Plus, MMC, USB, Mini USB, Micro USB, Compact Flash, Memory Stick, Memory Stick Micro, and Memory Stick PRO.

14. A memory card expander assembly comprising:
an assembly housing including an openable cover and operative to be attached to a housing of a host device;
an adaptor shaped to be connected to a memory card slot of the host device, the adaptor being connected to the memory card slot while the expander assembly is in use and being securable within the assembly housing and under the cover of the assembly housing when the adaptor is not connected to the memory card slot, wherein the assembly housing is operative to be physically attached to the housing of the host device while the adaptor is connected to the memory card slot;
a receptacle assembly provided in the assembly housing and operative to communicate with the adaptor, wherein the receptacle assembly includes an expanded memory card slot operative to connect to a memory card such that the host device can communicate with the connected memory card when the adaptor is connected to the memory card slot; and
a flexible cable connecting the adaptor to the receptacle assembly, wherein the flexible cable is retractable and stored on a spool in the assembly housing, the flexible cable being extendable to variable lengths to accommodate the distance from the receptacle assembly to the memory card slot of the host device.

15. The memory card expander assembly of claim 14, wherein the adaptor has a first physical size to fit into the memory card slot that only accommodates the first physical size, and wherein the expanded memory card slot and the connected memory card have a second physical size larger than the first physical size, and wherein the connected memory card having the second physical size is able to hold a greater amount of memory than a memory card having the first physical size.

16. The memory card expander assembly of claim 14 wherein the openable cover is in a closed position in normal use of the host device and openable by a user to allow the user to remove the adaptor from the assembly housing or to place the adaptor in the assembly housing.

17. The memory card expander assembly of claim 14 wherein the adaptor is a first adaptor coupled to a second adaptor by the flexible cable, and wherein the second adaptor is connected to a receptacle in the receptacle assembly, wherein the second adaptor is shaped differently than the first adaptor, and wherein the first adaptor can be connected to the receptacle assembly and the second adaptor is shaped to be connected to a different memory card slot that is sized differently than the memory card slot, the different memory card slot provided on at least one other host device.

18. The memory card expander assembly of claim 14 wherein the flexible cable is routed through one of a plurality of openings in the side of the assembly housing while the adaptor is connected to the memory card slot and while the openable cover is in a closed position.

19. The memory card expander assembly of claim 14 wherein a rim of the assembly housing includes a compliant or compressible material allowing a seal between the openable cover and a baseboard of the assembly housing, and allowing the passage of the flexible cable at any location through the compliant and compressible material while the openable cover is in a closed position.

20. The memory card expander assembly of claim 14 wherein the receptacle assembly includes a wireless transmitter and wireless receiver operative to wirelessly communicate with the adaptor while the adaptor is connected to the memory card slot of the host device, and wherein the adaptor includes a wireless transmitter and wireless receiver for data communication and transmission.

21. A method for expanding a memory capacity of a host device, the method comprising:
- providing a memory card expander housing attached to the housing of a host device, wherein a receptacle assembly provided in the memory card expander housing includes an expanded memory card slot operative to receive a memory card;
- providing an adaptor shaped to be connected to a memory card slot of the host device and which is in communication with the receptacle assembly, the adaptor operative to be connected to the memory card slot while the memory card expander housing is physically attached to the housing of the host device, the adaptor operative to be connected in the memory card slot when the memory card expander is in use and operative to be secured within the assembly housing and under the cover of the assembly housing when the memory card expander is not in use, wherein the host device can communicate with the connected memory card when the adaptor is connected to the memory card slot; and
- providing a flexible cable connecting the adaptor to the receptacle assembly, wherein the flexible cable is retractable and stored on a spool in the memory card expander housing, the flexible cable being extendable to variable lengths to accommodate the distance from the receptacle assembly to the memory card slot of the host device.

22. The method of claim 21 wherein the receptacle assembly communicates with the adaptor using wireless radio frequency transmission, the adaptor being a separate physical unit that can be stored inside the expander housing when not in use and connected to the memory card slot outside the expander housing when in use.

* * * * *